US008536049B2

(12) United States Patent
Reddington et al.

(10) Patent No.: US 8,536,049 B2
(45) Date of Patent: Sep. 17, 2013

(54) METHOD FOR FORMING METAL CONTACTS

(75) Inventors: Erik Reddington, Ashland, MA (US); Thomas C. Sutter, Holden, MA (US); Lujia Bu, Holden, MA (US); Alexandra Cannon, Framingham, MA (US); Susan E. Habas, Boulder, CO (US); Calvin J. Curtis, Lakewood, CO (US); Alexander Miedaner, Boulder, CO (US); David S. Ginley, Evergreen, CO (US); Marinus Franciscus Antonius Maria Van Hest, Lakewood, CO (US)

(73) Assignees: Rohm and Haas Electronic Materials LLC, Marlborough, MA (US); Alliance for Sustainable Energy, LLC, Golden, CO (US)

( * ) Notice: Subject to any disclaimer, the term of this patent is extended or adjusted under 35 U.S.C. 154(b) by 32 days.

(21) Appl. No.: 13/273,588

(22) Filed: Oct. 14, 2011

(65) Prior Publication Data

US 2012/0129332 A1 May 24, 2012

Related U.S. Application Data

(60) Provisional application No. 61/393,295, filed on Oct. 14, 2010.

(51) Int. Cl.
*H01L 21/4763* (2006.01)
(52) U.S. Cl.
USPC .................................. 438/636; 257/E21.029
(58) Field of Classification Search
USPC .................. 438/660, 663, 666, 678, 72, 636, 438/952; 257/E27.123, E21.029
See application file for complete search history.

(56) References Cited

U.S. PATENT DOCUMENTS

| 5,543,333 | A  | * | 8/1996 | Holdermann | 438/97 |
| 7,556,748 | B2 | * | 7/2009 | Wang et al. | 252/514 |
| 7,736,546 | B2 | * | 6/2010 | Prunchak | 252/519.14 |
| 2008/0003364 | A1 | | 1/2008 | Ginley et al. | |
| 2008/0035489 | A1 | | 2/2008 | Allardyce et al. | |
| 2009/0238994 | A1 | | 9/2009 | Mette et al. | |
| 2009/0239331 | A1 | | 9/2009 | Xu et al. | |
| 2010/0124619 | A1 | | 5/2010 | Xu et al. | |

FOREIGN PATENT DOCUMENTS

WO   WO 2009/059302 A1   5/2009

OTHER PUBLICATIONS

Recart et al, "Screen printed boron emitters for solar cells", Solar Energy Materials & Solar Cells, 2007, pp. 897-902, vol. 91.
Cheknane et al, "Minimization of the effect of the collecting grid in a solar cell based silicon", Solar Energy Materials & Solar Cells, 2005, pp. 557-565, vol. 87.
Hwang et al, "A novel flexible silver paste enables thin film photovoltaic flex solar cells", Indium Corporation.

(Continued)

*Primary Examiner* — Quoc Hoang
(74) *Attorney, Agent, or Firm* — John J. Piskorski

(57) ABSTRACT

Methods of forming metal contacts with metal inks in the manufacture of photovoltaic devices are disclosed. The metal inks are selectively deposited on semiconductor coatings by inkjet and aerosol apparatus. The composite is heated to selective temperatures where the metal inks burn through the coating to form an electrical contact with the semiconductor. Metal layers are then deposited on the electrical contacts by light induced or light assisted plating.

13 Claims, 5 Drawing Sheets

(56) References Cited

OTHER PUBLICATIONS

Lin et al, "Structural properties of the solidified-Al/regrown-Si structures of printed Al contacts on crystalline Si solar cells", Solar Energy Materials & Solar Cells, 2008, pp. 986-991, vol. 92.

Lin et al, "Investigation of Ag-bulk/glassy-phase/Si heterostructures of printed Ag contacts on crystalline Si solar cells", Solar Energy Materials & Solar Cell, 2008, pp. 1011-1015, vol. 92.

European Search Report of corresponding European Application No. 11 18 5113, Apr. 19, 2013.

* cited by examiner

METHOD FOR FORMING METAL CONTACTS

This application claims the benefit of priority under 35 U.S.C. §119(e) to U.S. Provisional Application No. 61/393,295, filed Oct. 14, 2010, the entire contents of which application are incorporated herein by reference.

The United States Government has rights in this invention under Contract No. DE-AC36-08GO28308 between the United States Department of Energy and the Alliance for Sustainable Energy, LLC as contract operator of the National Renewable Energy Laboratory.

BACKGROUND

Metal based contacts of semiconductors, such as in photovoltaic devices, involves the formation of electrically conductive contacts on the front side or the side of the semiconductor which is illuminated by incident light and the back side or the side which is not illuminated by incident light. The metal coating establishes Ohmic contact with the semiconductor so that charge carriers emerge from the semiconductor into the electrically conductive contacts without losses and with long lifetimes. In order to avoid current loss, metalized contact grids have adequate current conductivities, e.g., a high conductivity or a sufficiently high conductor track cross section.

Numerous processes which meet the above requirements exist for metal coating the back side of solar cells. For example, in order to improve current conduction at the back side of solar cells, p-doping directly under the back side is increased. Usually aluminum is used for this purpose. The aluminum is applied, for example, by vapor deposition or by being printed onto the back side and being driven in or, respectively, alloyed in. When metal coating the front sides or illuminated sides, the objective is to achieve the least amount of shading of the active semiconductor surface in order to use as much of the surface as possible for capturing photons.

The method used commercially to form the front side contacts in solar cells is the application of a metallic paste by screen printing. The paste contains metal particles (typically silver) to provide electrical conductivity, as well as glass frit, rheology modifiers, and a high boiling solvent, such as terpineol. After printing, the cell is dried, and then typically fired in a belt furnace at temperatures ranging from about 600-1000° C. Upon firing, the glass frit will react with, or "burn-through", an antireflection coating (typically silicon nitride) on the front side and helps provide adhesion to the cell. Use of a screen printed paste is the industry standard but has disadvantages. Screen printing is a contact method of printing, requiring significant handling of fragile silicon solar cells, resulting in a significant amount of accidental breakage. It also generates chemical waste, municipal waste, and an added expense in the form of broken screens. Finally, the smallest line widths that can be generated in production are physically limited by screen technology to be in the range of about 80-100 microns. Smaller line widths by screen printing may be physically possible in the laboratory, but are more difficult to achieve in mass production at the present time.

More complex processes for producing the front side contacts make use of laser or photolithographic techniques for the definition of current track structures. Currently these techniques can produce narrower lines but at the expense of through-put. The current tracks are then metalized. In general, various metal coating steps are often used in order to apply the metal coating in attempting to achieve sufficient adhesive strength and a desired thickness for electrical conductivity. For example, when wet-chemical metal coating processes are used, a first fine metal coating is deposited on the current tracks by means of palladium catalyst. This is often reinforced with electroless deposition of nickel. In order to increase the conductivity, copper may be deposited on the nickel by electroless or electrolytic deposition. The copper may then be coated with a fine layer of tin or silver to protect it from oxidation.

Alternatively, current tracks may be metalized using a light induced plating process. This metallization process involves first metalizing the back side of the solar cell using conventional methods of printing and sintering an electrically conductive paste in an inert gas atmosphere. Such pastes may include silver, aluminum and frit with organic binders. Other metals such as nickel, palladium, copper, zinc and tin also may be burned in the paste. The front side of the solar cell is coated with a passivation or antireflection layer of silicon oxide or silicon nitride. Trenches for current tracks are formed in the antireflection layer which extends into the semiconductor. Trenches may be formed using photolithography, laser writing or mechanical erosion. The current tracks of the front side are then plated with nickel by light induced plating. The solar cell is placed in a nickel plating bath and light is applied to the solar cell and a nickel layer is generated on the semiconductor material after approximately 1-2 minutes. A further metal layer, such as copper, may be directly generated over this nickel layer for reinforcement. The copper layer may be protected from oxidation by applying a thin layer of silver or tin over the copper layer.

Another method of forming metal contacts on a solar cell is as follows. Current tracks are formed by using a laser which selectively removes portions of the antireflective layer to expose the underlying semiconductor material. However, laser applications are costly and in general less costly methods are preferred in the industry Ink which contains metal nanoparticles in the range of about 20 nm to 1000 nm is applied to the exposed semiconductor material by inkjet or aerosol apparatus. The device is heated to temperatures of about 100° C. to 900° C. for a term lasting from one second to thirty minutes to drive off any solvent and form the metal contacts. These contacts are then reinforced with additional metal layers by electroplating.

Although there are methods for forming metal contacts on semiconductors, there is still a need for an improved method of making the initial metal contacts on semiconductors.

SUMMARY

An example of a method includes providing a burn-through metal ink; selectively applying the burn-through metal ink to an anti-reflective coating on a semiconductor substrate; firing the semiconductor substrate with the anti-reflective-coating and the burn-through metal ink to provide Ohmic contact between the metal from the burn-through metal ink and the semiconductor substrate; and depositing one or more layers of a metal on the metal from the burn-through metal ink by light induced plating.

The burn-through metal inks include one or more sources of metal and one or more agents that burn-through the anti-reflective coating upon firing to enable the metals of the ink to form ohmic contact with the underlying semiconductor. Additives such as solvents, surfactants, dispersants, binders, complexing agents, reducing agents, rheology modifiers and chelating agents may also be included in the burn-through metal inks.

The metal contacts made according to the method increase performance of semiconductor devices and thus provide increased power output in comparison to many conventional semiconductor devices of comparable size and unit area. The method enables the formation of fine line metal contacts which reduce shadowing and improve incident light absorption. The burn-through process reduces the number of steps in the manufacture of semiconductor articles by eliminating such steps as photolithography and laser writing in formation of the metal contacts and reduces breakage of materials thus reducing the overall cost of manufacturing semiconductor devices. In addition, the burn-through process of forming a metal seed layer followed by light induced plating of additional metal layers on the seed layer provides improved Ohmic contact between the metal layers and the semiconductor surface in contrast to many conventional semiconductor devices.

DETAILED DESCRIPTION

As used throughout this specification, the terms "depositing" and "plating" are used interchangeably. The terms "current tracks", "current lines" and "metal contacts" are used interchangeably. The terms "composition" and "bath" are used interchangeably. The indefinite articles "a" and "an" are intended to include both the singular and the plural. The term "front side" means the illuminated side of the semiconductor wafer or the side that is exposed to incident light. The term "back side" means the non-illuminated side of the semiconductor wafer or the side that is not exposed to incident light. The term "selectively depositing" means that metal deposition occurs in specific desired areas on a substrate. The term "unit area" and "surface area" are used interchangeably throughout this specification. The term "Ohmic contact" is a region on a semiconductor device that has been prepared such that the current-voltage (I-V) curve of the device is linear and symmetric. The term "Schottky contact" is a region on a semiconductor device such that the current-voltage (I-V) curve of the device is non-linear and asymmetric. Full cell efficiency is represented by the following: $\eta = P_m / E \times A_c$ where $P_m$ is maximum power point, E is input light irradiance in Watts per meter squared and $A_c$ is surface area of the solar cell in meters squared. The term "firing" means a melting or reacting of components and is generally done at temperatures at or above about 400° C.

The following abbreviations have the following meanings unless the context clearly indicates otherwise: ° C.=degrees Celsius; g=grams; mL=milliliter; L=liter; A=amperes; dm=decimeter; cm=centimeter; mm=millimeters; μm=microns; nm=nanometers; cP=centipoise=$10^{-2}$ poise=$10^{-3}$ pascal seconds; Hz=hertz; kHz=kilohertz; UV=ultra violet; IR=infrared; and SEM=scanning electron microscope.

All percentages and ratios are by weight unless otherwise indicated. All ranges are inclusive and combinable in any order except where it is clear that such numerical ranges are constrained to add up to 100%.

Photovoltaic devices and solar cells may be composed of, but not limited to, monocrystalline, polycrystalline or amorphous silicon semiconductor wafers. While the description below is with regard to silicon semiconductor wafers, other suitable semiconductor wafers, such as gallium-arsenide, silicon-germanium, germanium and cadmium-tellurium, may also be used. When silicon wafers are used, they typically have a p-type base doping.

The semiconductor wafers may have a wide variety of dimensions and surface resistivities. Such wafer dimensions include, but are not limited to, circular, square or rectangular in shape or may be any other suitable shape. Such wafers also may have interdigitated metal contacts on their non-illuminated sides.

Figure 1:
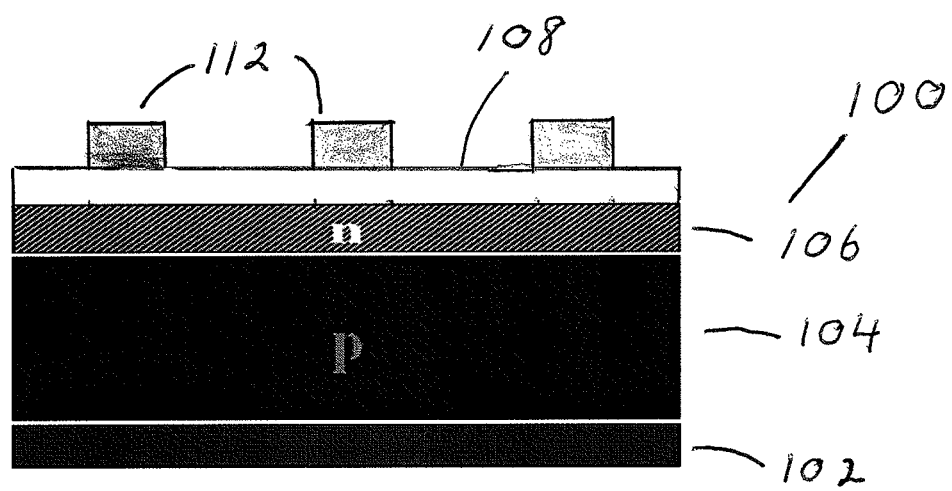
FIG. 1 illustrates a silicon solar wafer with an n doped region and a p doped region with a antireflective coating over the n doped region and selectively deposited liquid suspensions of burn-through metal ink.

In general, as shown in FIG. 1, the back side of a wafer 100 is metalized 102 to provide a low resistance wafer. The surface resistance, also known as sheet resistance, of the semiconductor wafer may range from 40 to 90 ohms/square, or such as from 40 ohms/square to 60 ohms/square, or such as from 60 ohms/square to 80 ohms/square.

Substantially the entire back side may be metal coated or a portion of the back side may be metal coated 102, such as to form a grid. Such metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other pastes which include metals such as nickel, palladium, copper, zinc or tin also may be used. Such conductive pastes typically include conductive particles, glass frit and an organic binder. Conductive pastes may be applied to the wafer by a variety of techniques, such as screen printing. After the paste is applied, it is fired to make electrical contact with the silicon and burn away the organic binder. Prior to firing, a drying step at lower temperature may optionally be employed. When a conductive paste containing aluminum is used, the aluminum partially diffuses into the back side of the wafer 100, or if used in paste form also containing silver, may alloy with the silver. Use of such aluminum-containing paste may improve the resistive contact and provide a "p+"-doped region 104. Heavily doped "p+"-type regions by previous application of aluminum or boron with subsequent inter-diffusion may also be produced. In one embodiment, an aluminum-containing paste may be applied and fired before the application of the non-illuminated side metal coating. The residue from the fired aluminum-containing paste may optionally be removed prior to the application of the metal coating. In an alternate embodiment, a seed layer may be deposited on the back side of the wafer and a metal coating may be deposited on the seed layer by electroless or electrolytic plating.

The front side of the wafer may optionally be subjected to crystal-oriented texture etching to impart to the surface an improved light incidence geometry which reduces reflections. To produce the semiconductor junction, phosphorus diffusion or ion implantation takes place on the front side of the wafer to produce an n-doped (n+ or n++) region 106 and provides the wafer with a PN junction. The n-doped region 106 may be referred to as the emitter layer.

An anti-reflective coating (ARC) 108 or layer is added to the front side or emitter layer of the wafer 100. In addition the anti-reflective layer may serve as a passivation layer. Suitable anti-reflective layers include, without limitation, silicon oxide layers such as $SiO_x$, silicon nitride layers such as $Si_3N_4$, or a combination of silicon oxide and silicon nitride layers. Typically silicon nitride is used. In the foregoing formulae, x is the number of oxygen atoms. Typically x is the integer 2. Such anti-reflective layers 108 may be deposited by a number of techniques, such as by various vapor deposition methods, for example, chemical vapor deposition and physical vapor deposition.

The front side of a wafer contains a metalized pattern. Such metalized patterns are typically current collecting lines and current bus bars; however, they may also include, but are not limited to, ionized etched spiral contacts. In general, current collecting lines are typically transverse to the busbars and typically have a relatively fine-structure, e.g., dimensions relative to current bus bars.

Figure 2:
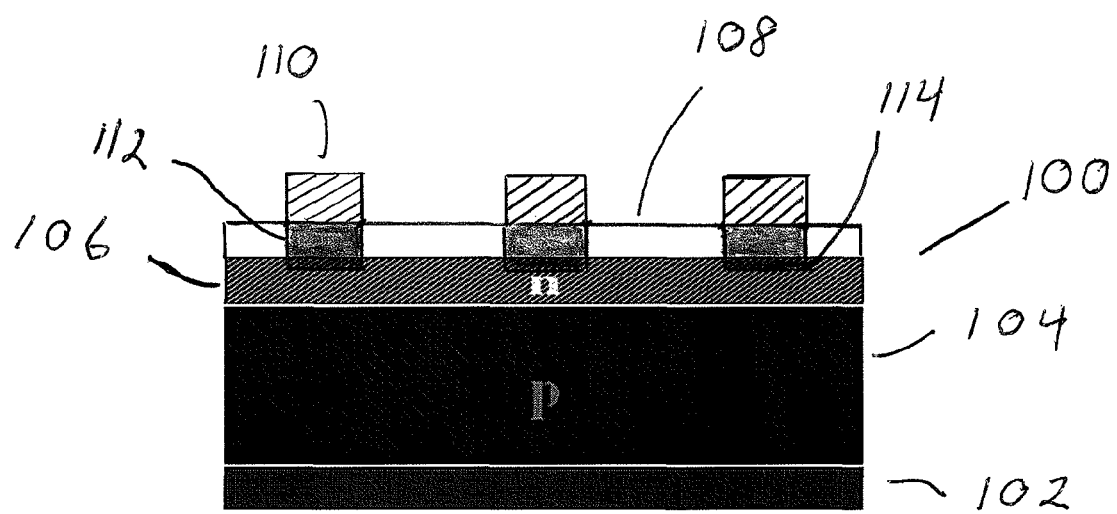
FIG. 2 illustrates a silicon solar wafer with an n doped region and a p doped region with a antireflective coating over the n doped region, ohmic contact between selectively deposited burned-through metal ink and plated metal on the burned-through metal ink.

As shown in FIGS. 1 and 2 the metalized pattern 110 is formed using burn-through metal inks 112 selectively applied to the coating or anti-reflective layer using a conventional inkjet or aerosol apparatus followed by firing and light induced plating of additional metal layers to complete the current tracks. The firing or burn-through step results in the formation of a secure bond between the metal from the burn-through ink and the semiconductor wafer 100 underlying the antireflective layer 108. In addition, the burn-through process establishes Ohmic contact 114 between the semiconductor wafer 100 and the metal 110 as well as any additional layer deposited by light induced plating.

Application of the burn-through metal inks by inkjet and aerosol is a non-contact method such that the burn-through metal ink is applied without direct contact between the nozzles of the apparatus and the semiconductor wafer. This reduces the probability of wafer damage during the manufacturing process. Application of the burn-through metal inks by either inkjet or aerosol allows the formation of narrow current tracks thus reducing shadowing and increasing incident light absorbance and at the same time enables more current tracks to be formed on the semiconductor wafer to increase output current. Current tracks may be less than or equal to about 75 μm wide, and in another embodiment, less than or equal to about 50 μm wide, and in another embodiment, less than or equal to about 20 μm to 25 μm wide.

The inkjet printing method may be a continuous inkjet method or a drop-on-demand method. The continuous method is a printing method where the direction of the metal ink is adjusted by changing an electromagnetic field while continuously jetting the metal ink using a pump. The drop-on-demand is a method which dispenses the metal ink only when needed on an electronic signal. Drop-on-demand may be divided into a piezoelectric ink jet method where pressure is generated by using a piezoelectric plate causing a mechanical change by electricity and a thermal ink jet method using pressures which are generated by the expansion of bubbles produced by heat.

In contrast to the inkjet printing method, the aerosol method first forms an aerosol of the metal ink. The aerosol is guided to the semiconductor substrate via a pressurized nozzle with the pressurized nozzle being mounted to a print head. The aerosol is mixed with a focusing gas and is transported to the pressurized nozzle in a focused form. The use of focusing gas to dispense the ink reduces the probability of clogging the nozzles and also enables the formation of finer current tracks, a greater aspect ratio than with an inkjet apparatus. The aspect ratio (height/width) of the current tracks may range from about 0.001 to 0.5, or such as from about 0.002 to 0.4, or such as from about 0.002 to 0.04 per pass of the printer. The higher the aspect ratio per pass the more efficient is the method.

In one embodiment the burn-through metal inks are selectively inkjet printed in air or inert environment (e.g., nitrogen or argon) onto a $SiO_x$ or silicon nitride antireflective layer at room temperature. A drop generation rate of 100 Hz to 20000 Hz may be used resulting in a deposition rate of about 0.02 μm to 10 μm per pass. Thicker deposits may be obtained by inkjet printing multiple layers.

The burn-through metal inks include one or more of metal, metal precursors, metal organic precursors, metal complexes, or metal salts to supply the conductive materials. The metal inks also include one or more of glass frit, ball-milled or otherwise ground glass frit, metal organic precursors, or metal salts as the burn-through agents. Typically the conductive materials and the burn-through agents are in particle form. Preferably, the burn-through metal inks include metal particles and particles of glass frit.

The particles may range in size from about 5 μm or less, or such as from about 0.1 μm to 1 μm. Preferably, the particles are nanometer-sized particles. Nanometer-sized particles have improved performance over particles of greater dimensions because the surface area per unit mass increases as compared to larger bulk particles and presents a different physiochemical characteristic from the particles of larger diameter. Typically, the metal nanoparticles range in diameter from about 1000 nm or less, preferably the metal nanoparticles range from about 25 nm to 800 nm, and in another embodiment, from about 100 nm to 400 nm. Metals include, but are not limited to, silver, copper, nickel, gold, palladium and salts and complexes thereof. Typically, silver, copper, and nickel are used. Commercially available sources of metals may be used or may be made. Typically, metal particles dispersed in a solvent medium, where the metal is in its metallic state is used. Silver salts include, but are not limited to, silver nitrate, silver oxide, silver halides, silver cyanide, silver acetate, silver carbonate, silver oxalate, silver trifluoroacetate, silver acetonyl acetonate, silver benzoate, silver citrate, silver lactate, silver cyclohexane butyrate, silver tetrafluoroborate, silver pentafluoropropionate, silver p-toluenesulfonate, silver trifluoromethanesulfonate. Nickel salts include, but are not limited to, nickel amidinate, nickel acetyl acetonate, nickel acetate, nickel carbonate, nickel citrate, nickel cyclohexanebutyrate, nickel tartrate, nickel oxide, nickel tartrate, nickel formate. Copper salts include, but are not limited to, copper amidinate, copper formate, copper oxide, copper cyclohexanebutyrate, copper 2-ethylhexanoate, copper acetyl acetonate, and copper acetate. Typically, metal nanoparticles are included in the burn-through metal inks in amounts of about 0.1 wt % to 10 wt %, and in another embodiment from about 0.5 wt % to 5 wt %.

Glass frits are compositions which may include various oxides, such as PbO, $SiO_2$, $B_2O_3$, ZnO, $Bi_2O_3$, $SnO_2$ and $Al_2O_3$. Commercial glass frits are typically kept proprietary but are known to include one or more of the various oxides. In general, the glass for the frits is formed by refluxing and homogenizing the oxide constituents at high temperatures (e.g., above about 1000° C.), and then grinding and milling of the glass to produce glass frit powder that is provided in commercial pastes. The glass frits may be ball-milled using conventional ball-milling procedures to obtain particles having diameters in the range of about 1000 nm or less, and in another embodiment from about 50 nm to 200 nm. Alternatively, glass frit can be synthesized to be in the nanometer range by synthetic techniques, such as by a flame spray process. Typically, nanoparticles of glass frits are included in the burn-through metal inks in amounts of about 0.05 wt % to 20 wt %, and in another embodiment from about 0.5 wt % to 5.5 wt %. Alternatively, a metal salt or metal organic (MO) precursor may be used in place of glass frit or nanosized glass frit. This alternative burn through agent may be a metal salt or MO precursor containing either Pb, Si, B, Zn, Bi, Sn, or Al, or mixtures of these or like materials.

One or more sources of metal are mixed with one or more of the burn-through agents in one or more solvents to form a liquid suspension of particles, preferably nanoparticles, suitable for inkjet printing or aerosol printing. The burn-through metal inks are not pastes or gels but are liquid suspensions of particles, preferably nanoparticles, in one or more solvents at room temperature as well as at inkjet temperatures. Typical viscosities measured for such inks are in the range of about 1 to 100 cP at 25° C., and in another embodiment in the range of about 5 to 75 cP at 25° C. Solvents include, but are not limited to, water, ethyl lactate, aldehydes, alcohols, such as ethanol, methanol, isopropanol, ethylene glycol, diethylene glycol, propylene glycol monomethyl ether, propylene glycol monomethyl ether acetate, terpineol, triethylene glycol, propylene glycol, dipropylene glycol, hexylene glycol or glycerine, polyethers, such as diglymes, triglymes, tetraglymes, ethylene glycol mono- and bis alkyl ethers, or mixtures thereof. Solvents may be included in the burn-through metal inks as the balance of the burn-through metal ink or added to provide about 100 wt %.

Alternatively, the metal inks may include metal organic precursors (MO) and reducing agents as either the source of conductive metal or the source of the burn-through agent. One or more solvents as mentioned above may be included to form a suspension of nanoparticles. A wide variety of MO precursors may be used for producing burn-through metal inks. The MO precursors include metal ions (M) that are reduced to their metallic state at a potential positive of the reduction potential of the reducing agent (e.g., about −0.20 V for formate), or upon heating in the presence of a reducing agent. Metal ions of metals include, but are no limited to, silver, copper, lead, nickel, gold, palladium and platinum.

The reducing agent may provide a source of electrons for reaction with the MO precursor. At room temperature, the reducing agent does not react with the MO precursor. Accordingly, the MO precursor may remain soluble, e.g., as a metal ink solution that is suitable for inkjet printing. Reducing agents include, but are not limited to, formate, halide, nitrate salts, alcohols, aldehydes, acetals, ethylene glycol, ethylene glycol diformate, benzaldehyde, acetaldehyde or mixtures thereof. MO precursors may be included in the burn-through metal inks in amounts of about 0.1 wt % to 70 wt %, or such as from about 15 wt % to 50 wt %.

In addition to solvents, the burn-through metal inks may include other additives, such as binders, dispersants and surfactants for enhancing deposition, resolution and adhesion of the metal inks to the antireflective layers. Examples of commercially available dispersants are the DISPERBYK dispersants, such as DISPERBYK180, DISPERBYK181, DISPERBYK182, and DISPERBYK183, the BYK dispersants, such as BYK301, BYK302, BYK306, and BYK320 (both available from Byk Chemie, Wallingford, Conn.), and the TAMOLs™ Dispersants, such as TAMOL 681, TAMOL 1124, TAMOL 1254, TAMOL 165A, and TAMOL 2002 Dispersants (available from The Dow Chemical Company, Midland, Mich.). Dispersants may be used in the range from 0.01 wt % up to 10 wt %. Commercially available surfactants include, but are not limited to, TERGITOL™ TMN-10 Surfactant, TERGITOL 15-S-9, TERGITOL TMN-6, TERGITOL 15-S-30, PLURONIC 31R1, PLURONIC 103, and PLURONIC 121. Commercially available binders include, but are not limited to, MORCRYL 350, MORCRYL 430 PLUS, and LUCIDENE 604.

Burn-through may be done at temperatures of at least about 400° C., and in another embodiment, about 400° C. to 1000° C., and in another embodiment from about 650° C. to 1000° C. The burn-through process may be done in conventional ovens or in an infrared (IR) belt furnace. The process of burn-through reduces or altogether eliminates the need for conventional imaging, photolithography, laser writing or etching methods which selectively remove portions of the antireflective layer prior to metallization. Reduction or elimination of such steps improves the efficiency of the manufacturing method by reducing processing time as well as the cost of manufacture by foregoing the materials used in conventional processes.

The metal seed layer deposited by the burn-through method ranges from about 0.1 to 12 microns or such as from about 0.25 to 2.5 microns. The seed layer is then built-up with at least one additional metal layer by light induced plating (LIP). Additional metal layers may include, but are not limited to, metals such as silver, copper, nickel, gold, palladium or platinum. The additional metal may be silver, copper or nickel or the like. Light induced plating is done until a metal thickness of the plated layer of at least about 1 micron is achieved, or such as about 5 to 20 microns, or such as about 10 to 15 microns.

Both electroless and electrolytic metal plating baths can be used to deposit the additional metal layers. Electroless and electrolytic metal plating baths may be used. If the metal is silver, a cyanide free silver electroplating bath may be used. If the source of the metal is an electroless bath, plating is done without application of external current. If the source of the metal is from an electrolytic bath, a rear side potential (rectifier) is applied to the semiconductor wafer substrate. Current densities may range from about 0.1 A/dm$^2$ to 10 A/dm$^2$, and in another embodiment, from about 0.5 A/dm$^2$ to 2 A/dm$^2$. The current requirement is dependent upon the size of the semiconductor wafer used. The light may be continuous or pulsed. The semiconductor is immersed in the metal plating bath and light is applied to the semiconductor. Light which may be used in the plating process includes, but is not limited to, visible light, IR, ultraviolet (UV) and X-rays. Light sources include, but are not limited to, incandescent lamps, light emitting diode (LED) lights, IR lamps, fluorescent lamps, halogen lamps and lasers.

The plating cell is of such a material as to be chemically inert with respect to the metal plating baths and typically has a minimum light transmittance of about 40-60%. Alternatively, the wafer can be positioned horizontally in the plating cell and illuminated from above, in which case the plating cell need not have at least the minimum light transmittance.

By illuminating the front side or emitter layer of the semiconductor wafer with light energy, plating occurs on the emitter layer of the semiconductor wafer. The impinging light energy generates a current in the semiconductor wafer. The rate of plating on the front is mainly controllable by the applied current from a current source, typically a rectifier. Adjusting the light intensity, bath temperature, reducing agent activity, starting wafer conditions, doping level as well as other parameters may also affect the plating rate.

The metal contacts made according to the method increase the efficiency of semiconductor devices thus providing increased power output compared to many conventional semiconductor devices of comparable size and unit area. Parameters such as open circuit current ($I_{SC}$), fill factor (FF) and full cell efficiency are higher for semiconductors made according to the burnt-through and light induced plating method than many conventional processes for manufacturing semiconductor devices. FF is a defining term for the overall behavior of a semiconductor device. The higher the FF the greater is the resulting efficiency. The FF of the semiconductor devices of the burn-through and LIP method has a higher FF than many conventional devices of comparable size and unit area. Typically, such parameters are measured in the industry using apparatus known as solar simulators. Examples of such simulators are QuickSun® 120CA, 540LA and the 700A cell solar simulators obtainable from Endeas Oy, Espoo, Finland. Such apparatus are used in the characterization of both crystalline and thin film photovoltaic products.

The method also enables the formation of fine line current tracks which reduces shadowing and improves incident light absorption. The burn-through and light induced plating process reduces the number of steps in the manufacture of semiconductor articles by eliminating such steps in alternative methods as photolithography and laser writing and reduces breakage of materials thus reducing the overall cost of manufacturing semiconductor devices. In addition, the burn-through and light induced plating process provides improved Ohmic contact between the metal layers and the semiconductor surface in contrast to many conventional semiconductor devices. Also, the methods result in less metal applied to the cell resulting in lower cell material costs. This is especially desirable when using precious metals for seed layers or build-up metal layers. In addition, the method of printing a burn-through ink with light induced plating can provide throughput of a wafer per second or better on a manufacturing line.

The following examples are included for purposes of illustration but are not intended to be limiting in scope.

Example 1

A burn-through metal ink was prepared by mixing 20 wt % powdered silver metal nanoparticles prepared by the method disclosed in B. Y. Ahn, E. B. Duoss, M. J. Motala, X. Guo, S.-I. Park, Y. Xiong, J. Yoon, J. Yoon, R. G. Nuzzo, J. A. Rogers, and J. A. Lewis, "Omnidirectional Printing of Flexible, Spanning, and Stretchable Silver Microelectrodes," *Science*, 323, 1590-93 (2009), 5 wt % nanoparticles of a commercially available proprietary PbO paste containing glass frit and ethylene glycol solvent in sufficient amount to bring the metal ink composition to 100 wt % and form a uniform suspension of nanoparticles. The silver nanoparticles had an average diameter range of 250-350 nm and the nanoparticles of the PbO glass frit paste had an average diameter range of 50-150 nm. The PbO glass frit paste was blended with a mixture of 60 wt % ethylene glycol and 40 wt % water to form a uniform suspension. The suspension was then ball milled for 24 hours using 1 to 0.1-5 mm zirconia beads in the presence of commercially available TAMOL™ 681 Dispersant to provide nanosized particles.

Sixty doped monocrystalline and multicrystalline silicon wafers having pyramidal elevations on their front side and with a surface area of 243 cm² were provided (commercially available from Wafernet, San Jose, Calif.). Each doped silicon wafer had an n+ doped zone on the front side of the wafer forming an emitter layer. Each wafer had a pn-junction below the emitter layer. The front side of each wafer was coated with a passivation or antireflective layer composed of $Si_3N_4$. The back side of each wafer was p+ doped and coated with a screen printed, commercially available aluminum solar paste (commercially available from Electroscience Laboratories, King of Prussia, Pa.).

The silver ink was placed in the reservoir of a Direct-Mask™ DoD 65 inkjet printing apparatus (commercially available from SCMID GmbH and Co., Freudenstadt, Germany). Twenty of the monocrystalline doped wafers were placed on the application plate of the inkjet apparatus one at a time and the silver ink was selectively deposited on the $Si_3N_4$ antireflective layer to form a plurality of parallel current tracks. The inkjet nozzles passed over each deposition site five times to form current tracks. The temperature of the printhead was 35° C., and the width of material deposited was 80 microns. The drop frequency of the printhead was 5 kHz. The platen (stage) was heated to 70° C. The pattern printed contained 69 current lines with 2 bus bars (2 mm wide). The line width of the current lines as printed was 80 microns. After application of the seed layer, each wafer was air dried and then fired in an IR belt furnace (commercially available from Sierra Therm, Watsonville, Calif.). The wafers were heated to 850° C. for 5 seconds to drive off solvent from the silver ink and have the silver metal ink burn-through the $Si_3N_4$ antireflective coating and form Ohmic contact with the underlying emitter layer of the semiconductor wafer. The wafers were then removed from the oven and allowed to cool to room temperature.

Each wafer was then examined by an Amray 1830 scanning electron microscope (SEM) commercially available from Amray Inc., Bedford, Mass. to determine the height and width of the silver seed layer of each current track. The average height was determined to be 0.5 microns and the average width was determined to be 80 microns.

The method of inkjet printing current tracks was repeated on the remaining wafers. Twenty wafers received ten passes of silver ink and twenty wafers received twenty passes of silver ink to form 69 current tracks on each wafer. The wafers that underwent 10 passes of material averaged 1 micron thickness with an average width of 80 microns The wafers that underwent 20 passes of material averaged 2 micron thickness with an average width of 80 microns. The wafers were heated to 850° C. for 5 seconds to drive off solvent from the silver ink and have the silver metal ink burn-through the $Si_3N_4$ antireflective coating and form Ohmic contact with the underlying emitter layer of the semiconductor wafer. The wafers were placed in the convection oven and heated for 10 minutes at 800° C. to 825° C. to drive off solvent from the silver ink and to allow the silver metal to burn-through the $Si_3N_4$ coating and allow the silver from the ink to form Ohmic contact with the emitter layer of the wafer. The wafers were removed from the oven and allowed to cool to room temperature.

Each wafer was then examined using the same SEM to determine the height and width of each current track. The average height for the wafers which had 10 passes of ink was determined to be 1 micron and the average width was determined to be 80 microns. The wafers which received 20 passes of ink had an average height of 2 microns and an average width of 80 microns.

The current tracks of half of the wafers were then plated by light induced plating with a 10 micron layer of silver metal using an aqueous cyanide free silver metal electroplating bath as disclosed in the table below.

| COMPONENT | AMOUNT |
| --- | --- |
| Silver as silver methane sulfonate | 9 g/L |
| Methane sulfonic acid solution (70% neutralized with potassium hydroxide solution) | 15 g/L |
| Glycine | 10 g/L |
| Borax | 25 g/l |
| 4-nitrophthalic acid | 4 g/L |
| Nicotinic acid amide | 15 g/l |
| 1,3-didecyl-2-methylimidazolium chloride (1% aqueous solution) | 5 mL/L |

Sufficient volume of the silver electroplating bath was placed in a plurality of plating cells to fill the cells. The pH of the bath ranged from 9.5 to 10.5. The bath temperature was maintained at 25° C. to 35° C. during plating. The plating cells were equipped with a 250 Watt lamp and a silver anode. Half the wafers were immersed in the plating cells with the bath. A conventional rectifier provided the source of electrical current. The bath, wafers, silver anode and rectifier were in electrical communication with each other. Current density of 1-5 A/dm$^2$ was applied along with irradiation from the lamp. Plating was done for 15 minutes to deposit a layer of 10 microns of electroplated silver over the silver seed layer.

The electroplated silver was then evaluated for adhesion using the tape test method: IPC-TM-650 2.4.1. A strip of 1.27 cm wide 3M 600 Brand tape (commercially available from 3M Company, St. Paul, Minn.) was affixed to the sample. After removing any entrapped air and adhering for less than a minute, the tape was removed briskly at a 90 degree angle to the surface of the wafer. No silver was observed to be removed from the wafer after the tape test.

Example 2

Figure 3:
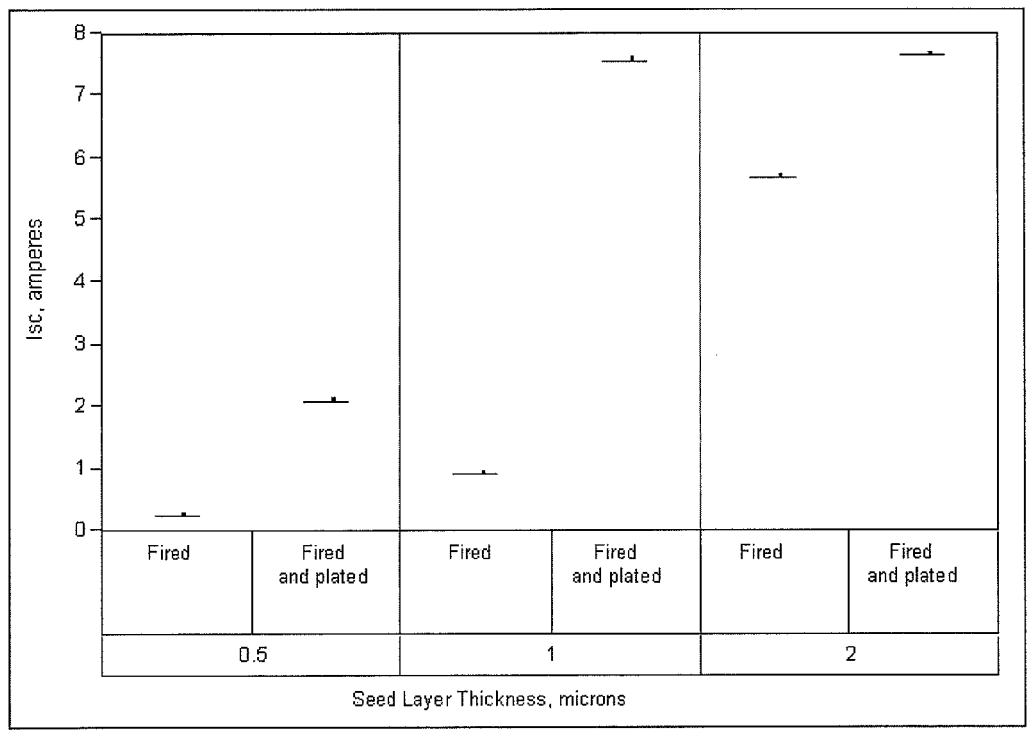
FIG. 3 illustrates a short circuit current of a crystalline silicon semiconductor wafer with silver metal contacts prepared with a fired glass frit silver ink versus the short circuit current of a semiconductor wafer with silver metal contacts prepared with a fired glass frit silver ink with an additional light induced plated silver layer according to an example.

The $I_{SC}$ of each wafer was then determined using commercially available QuickSun® 120CA cell solar simulator with the irradiance decay cell analysis method (IDCAM). Samples with seed layer thicknesses of 0.5 microns, 1 micron, and 2 microns were fired at 850 C for 5 seconds. The $I_{SC}$ of each wafer was measured in amperes. The samples were then electroplated by light induced plating in the bath described in Example 1 at a current density of 1.5 ASD. The average values were graphically compared as illustrated in FIG. 3. The wafers which were both fired and light induced plating plated had the highest average $I_{SC}$ values. Wafers which had 1 or 2 micron seed layers showed the highest average $I_{SC}$ values of around 8 amps. The addition of the light induced plating silver layer to the seed layer improved photogenerated current.

Example 3

Figure 4:
FIG. 4 illustrates the efficiency of a crystalline silicon semiconductor wafer with silver contacts prepared with a fired glass frit silver ink versus the efficiency of a crystalline silicon semiconductor wafer with silver contacts prepared with a fired glass frit silver ink with an additional light induced plated silver layer according to an example.

The cell efficiency (CE) of each wafer discussed in Example 2 was determined using the QuickSun® 120CA cell solar simulator with the irradiance decay cell analysis method (IDCAM). The CE of each wafer was measured in percent. The average values were graphically compared as illustrated in FIG. 4. The wafers which were both fired and light induced plated had the highest average percent efficiency values. The wafers with seed layer thickness of 1 to 2 microns after inkjet printing showed the highest average percent efficiency values of around 12%. The combination of the burn-through and the light induced plating silver layer improved semiconductor efficiency.

Example 4

The ink in Example 1 was charged into the reservoir of an Optomec brand single nozzle R&D grade aerosol printer (commercially available from Optomec, St. Paul, Minn.). Using the printer, a pattern with 69 current lines and two bus bars was printed onto the surface of 5 solar cell wafers of the same type as in Example 1. The printer passed over each wafer fifty times to deposit the pattern. The printed line widths averaged 50 microns in width and 10 microns in height after printing. The wafers were fired under the same conditions as in Example 1, and the cells were also LIP plated under the same conditions in the same silver plating bath as in Example 1.

Figure 5:
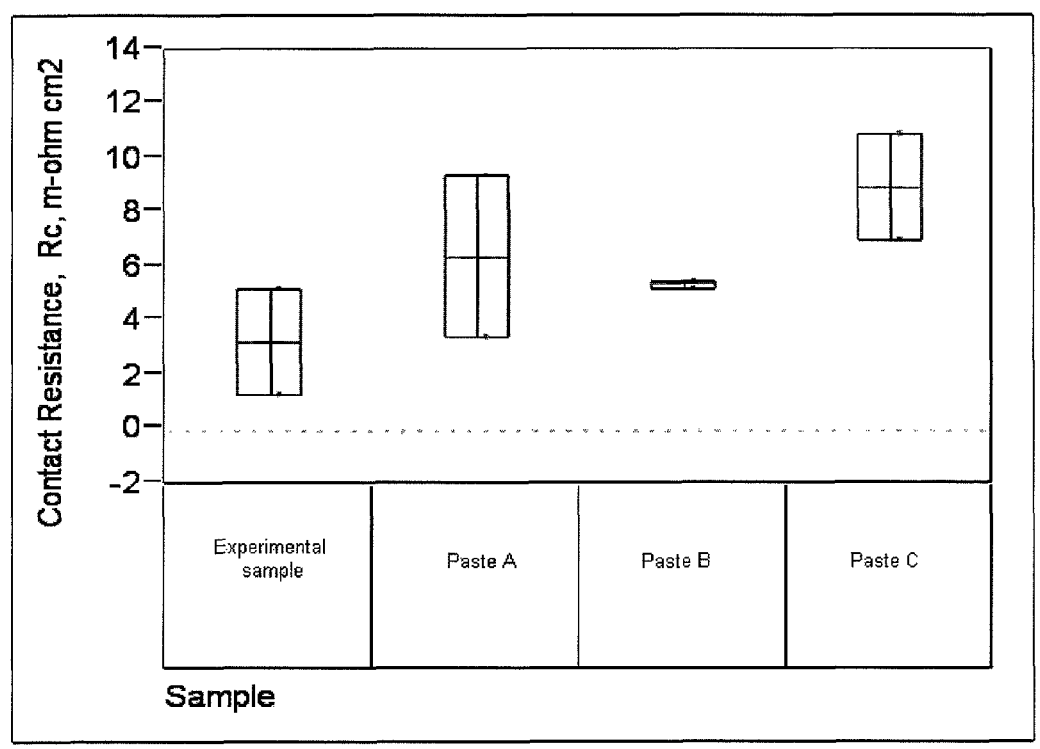
FIG. 5 illustrates the contact resistance of current lines in mOhm-cm$^2$ of metal contacts made by burn-through followed by light induced plating of silver versus contacts using burn-through pastes without light induced plating according to an example.

In addition, containing commercial paste samples A, B and C were screen printed to form 69 current lines 80 microns wide with 2 bus bars 2 mm wide onto wafers of the same type used in Example 1. These commercial pastes were typical of the industry, consisting of large 3-5 micron silver flake particles with glass frit containing PbO. The average line widths of the paste samples were between 80-100 microns wide and 8-10 microns thick. The cells were then fired and electroplated under the same conditions as the cells in Example 1. After plating, 2.3 cm wide strips of these cells were carefully removed with a wafer cutter. Similar 2.3 cm wide strips were removed from the cells with the seed layer deposited by the aerosol printer. These 2.3 cm wide strips from each cell in each case were cut in a parallel direction to the bus bars, and consisted of a series of electrically isolated 2.3 cm long parallel lines. From such a series of lines, the contact resistance can be measured by the transfer line method. Using a four point probe measurements with a source meter (commercially available from Keithley Series A 2600A SourceMeter, Cleveland, Ohio) and the transfer line method the contact resistance for each of the samples was calculated, and plotted in FIG. 5. The aerosol printed cells showed the lowest average contact resistance of all the samples. The aerosol printed cells with silver light induced plating have an improved contact resistance compared to the cells that were screen printed with silver light induced plating. The average contact resistance for the aerosol printed seed layer sample was on the order of 3 m-ohm-cm$^2$. The boxes represent the range of values for the data, and the center line of the box represents the average. A lower contact resistance showed that there was a decrease in overall resistance of the cell, leading to higher efficiencies.

What is claimed is:

1. A method comprising:
   a) providing a liquid suspension burn-through metal ink;
   b) selectively applying the liquid suspension burn-through metal ink to an antireflective coating on a semiconductor substrate by inkjet or aerosol;
   c) firing the semiconductor substrate with the antireflective coating and the liquid suspension burn-through metal ink to provide Ohmic contact between metal from the liquid suspension burn-through metal ink and the semiconductor substrate; and
   d) depositing one or more layers of a metal on the metal from the liquid suspension burn-through metal ink by light induced plating.

2. The method of claim 1, wherein the liquid suspension burn-through metal ink comprises metal in the form of metal powder, metal salts, metal organic compounds, metal complexes or mixtures thereof.

3. The method of claim 2, wherein the metal are particles having diameters of about 1000 nm or less.

4. The method of claim 2, wherein the metal is chosen from silver, gold, palladium, platinum, copper, tin, nickel, cobalt, iron and lead.

5. The method of claim 1, wherein the liquid suspension burn-through metal ink comprises one or more of glass frits, metal salts, metal complexes and metal organic compounds.

6. The method of claim 5, wherein the glass frit are particles having diameters of about 1000 nm or less.

7. The method of claim 6, wherein the glass frit is particles having diameters of about 50 nm to 200 nm.

8. The method of claim 5, wherein the glass frit comprises one or more oxides chosen from $PbO$, $SiO_2$, $B_2O_3$, $ZnO$, $Bi_2O_3$, $SnO_2$ and $Al_2O_3$.

9. The method of claim 1, wherein heating is done at temperatures of at least about 400° C.

10. The method of claim 1, wherein the metal layers deposited by light induced plating are chosen from silver, gold, palladium, platinum, copper, tin, nickel, cobalt, iron and lead.

11. The method of claim 1, wherein the metal layers deposited by light induced plating are about 5 microns to 20 microns thick.

12. The method of claim 1, wherein a viscosity of the liquid suspension burn-through metal ink is about 1 to 100 cP at 25° C.

13. The method of claim 12, wherein the viscosity of the liquid burn-through metal ink is about 5 to 75 cP at 25° C.

* * * * *